United States Patent
Allee et al.

(10) Patent No.: US 6,819,124 B1
(45) Date of Patent: Nov. 16, 2004

(54) DETECTION OF ELECTROMIGRATION IN INTEGRATED CIRCUITS

(75) Inventors: David R. Allee, Phoenix, AZ (US); Terry L. Alford, Phoenix, AZ (US)

(73) Assignee: Arizona Board or Regents, Tempe, AZ (US)

(*) Notice: Subject to any disclaimer, the term of this patent is extended or adjusted under 35 U.S.C. 154(b) by 18 days.

(21) Appl. No.: 10/234,403

(22) Filed: Sep. 3, 2002

Related U.S. Application Data

(60) Provisional application No. 60/316,469, filed on Sep. 2, 2001.

(51) Int. Cl.[7] .................. G01R 31/08; G01R 31/02; G01R 27/08
(52) U.S. Cl. .................. 324/713; 324/763; 324/525; 438/14
(58) Field of Search .................. 324/765, 158.1, 324/525, 527, 713, 719, 73.1, 537, 763, 693; 29/846; 438/14, 18; 716/4, 5

(56) References Cited

U.S. PATENT DOCUMENTS

| | | | | |
|---|---|---|---|---|
| 4,725,773 A | * | 2/1988 | Lieneweg | 324/73.1 |
| 5,208,530 A | * | 5/1993 | El-Ayat et al. | 324/765 |
| 5,497,076 A | * | 3/1996 | Kuo et al. | 324/158.1 |
| 5,514,974 A | * | 5/1996 | Bouldin | 324/763 |
| 5,857,258 A | * | 1/1999 | Penzes et al. | 29/846 |
| 6,614,251 B2 | * | 9/2003 | Ootsuji | 324/765 |

* cited by examiner

*Primary Examiner*—Anjan K. Deb
(74) *Attorney, Agent, or Firm*—Gallagher & Kennedy, P.A.; Thomas D. MacBlain

(57) ABSTRACT

A method and apparatus for detecting electromigration at its outset includes a pair of conductive traces deposited on a substrate in an integrated circuit. A multiplicity of conductors are connected along the length of the traces. Current is passed through the traces and the resistances of the traces from one conductor connection to the next are continually monitored by observing the voltage drop from one conductor to the next. The connection of the conductors to the traces may be less than one micrometer apart. When resistance changes as a result of the onset of electromigration, the exact location can be determined and studied in optical or scanning electron micrographs.

27 Claims, 1 Drawing Sheet

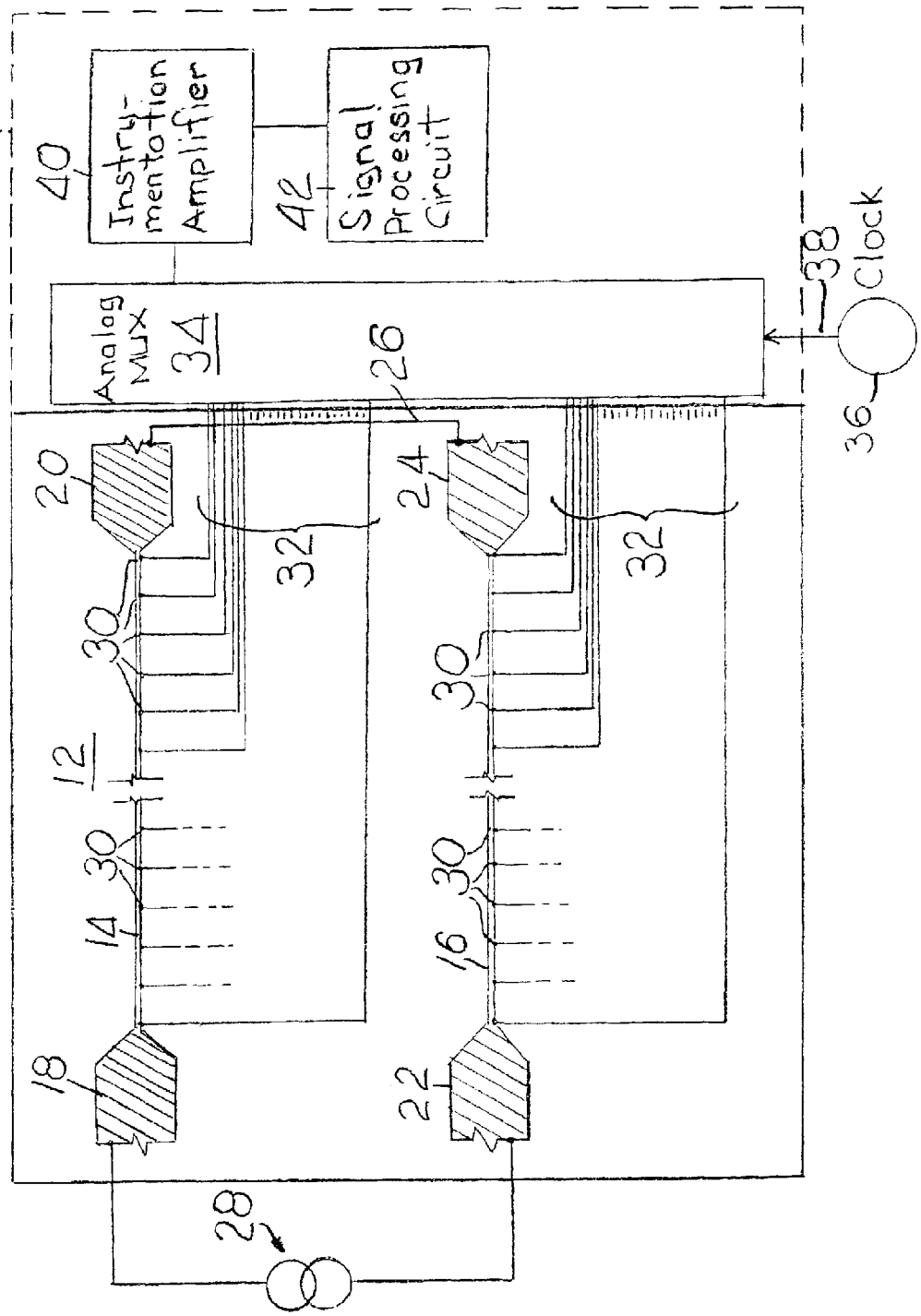

DETECTION OF ELECTROMIGRATION IN INTEGRATED CIRCUITS

CROSS REFERENCE TO RELATED APPLICATIONS

This application claims the priority of provisional application Ser. No. 60/316,469 filed Sep. 2, 2001 entitled "Improved Electromigration Resistance in Integrated Circuits," hereby incorporated by reference in its entirety.

FIELD OF THE INVENTION

This invention relates, in general, to integrated circuits and, more particularly, to detection of electromigration in integrated circuits.

BACKGROUND OF THE INVENTION

Electromigration has been identified as a primary failure mode of interconnect lines used in semiconductor integrated circuits. This high current-density induced mass-transport phenomenon manifests itself as voids, hillocks, or open circuits, due to a momentum exchange between conduction electrons and host metal atoms. As device dimensions shrink, the interconnect cross-sectional area reduces as well. This results in increased current densities. As the current densities reach the order 1 $MA/cm^2$, metallic lines start to fail as a result of void and hillock formation. This phenomenon, electromigration, is the result of mass transport due to large current densities. For typical room-temperature operation, this failure can be avoided by using larger feature sizes, biasing in a low-power mode, and/or replacing the Al or Cu with Ag. Traditionally, electromigration has been studied with a set of parallel interconnects or with a belch structure. Under elevated current stress and temperature stress, the interconnects are made to fail, and the failure point is studied after the event. It would be beneficial to study and/or predict the evolution of an electromigration failure, but this would require knowing where void and hillock formation are beginning along a long interconnect. Typically, this is very difficult to determine since the initial stages of electromigration present only subtle changes in optical or scanning electron micrographs.

SUMMARY OF THE INVENTION

In accordance with one embodiment of the present invention, there is provided a method and apparatus for measuring resistance indicative of the presence or absence of the onset of electromigration in metal traces such as, for example, interlevel metallization in integrated circuits. In one aspect of this embodiment, the location of electromigration failure in the metal trace is determined by measuring the resistance of short segments of the metal trace simultaneously. Thus, the metal trace is divided into small segments and the resistances of each small segment are repeatedly measured.

By way of example, the metal trace is divided into 100 segments. In another example the metal trace is divided into 1,000 segments. The number of segments into which the metal trace is divided is not a limitation of the present invention. Thus, the metal segment can be divided into thousands of segments, tens of thousands of segments, or even more segments. Preferably, the segments are less than one micrometer in length. A polling architecture is used to maximize the number of segments that can be monitored in real time. A rise in resistance in a particular segment indicates the early stages of void and hillock formation. Since the particular location is known, optical and electron microscopy can be used periodically to examine the evolution of the interconnect morphology. It should be understood that the metallic composition of the metal trace is not a limitation. For example, the metal trace can be copper, aluminum, or the like. In addition, the particular substrate on which the interconnects or the circuitry used to monitor the resistance is manufactured is not a limitation of the present invention. For example, the substrate can be silicon, germanium, silicon germanium, silicon on insulator (SOI), gallium arsenide and other compound semiconductor substrates, or the like.

A device for studying and/or predicting electromigration in integrated circuits includes at least one conductive trace with a multiplicity of connections to conductors. With a known current through the trace, the voltage drop between each pair of adjacent conductors is indicative of the resistance. Repeatedly monitoring the resistance permits a resistance change to be detected as an indication of electromigration. Preferably, according to one embodiment of the invention, the voltage drops across adjacent conductors are output to an analog multiplexer. Resistance indicating circuitry is stepped from the voltage across one pair of conductors output to another by a polling clock signal applied to the multiplexer.

In one embodiment, the voltage drop detected at each segment of the trace is amplified and the amplified voltage is used to indicate resistance of each trace segment defined between the connections to the conductors.

Preferably, in accordance with one embodiment of the invention, two substantially parallel traces are formed on a substrate and each has a multiplicity of connections to conductors for the observance of the resistance as indicated by the voltage drop from one conductor to the next. In another embodiment, a resistance meter is coupled to each pair of adjacent conductors along the length of the trace or traces. The resistance meter may be a resistance indicator dependent on voltage from one conductor to the next as applied through a multiplexer as previously described.

In accordance with one embodiment of the present invention, the circuitry used for measuring the resistance of the metal traces is external to the semiconductor material on which the metal trace is formed. In accordance with another embodiment of the present invention, the circuitry used for measuring the resistance of the metal trace is monolithically integrated on the semiconductor material on which the metal trace is formed. This integrated approach allows the most detailed monitoring of the interconnect segments, however it also requires that the circuitry operate at elevated temperatures. In yet another embodiment of the present invention, a portion of the circuitry used for measuring the resistance of metal trace is monolithically integrated on the semiconductor material and a portion is external to the semiconductor material on which the metal trace is formed. In both of these embodiments, the circuitry for monitoring the resistance of each segment traces monitors the resistance in real time while under temperature and current stress.

An advantage of the present invention is that it allows characterization of electromigration in real time as a function of device topographies—wafer level, circuit, and package parts. Further, the precise location of the initial stages of void and hillock formation can be determined. The approach of this invention allows for a model to be consistent and valid across all topographies proposed. The insight gained is immediately incorporated into process and reliability improvement efforts.

The above and further objects and advantages of the invention will be better understood in view of the following detailed description of at least one preferred embodiment taken in consideration with the accompanying drawings.

DESCRIPTION OF THE DRAWING

FIG. 1 is a schematic diagram partially in functional block diagram form illustrating a device for locating electromigration along a pair of substantially parallel traces in an integrated circuit.

DETAILED DESCRIPTION OF PREFERRED EMBODIMENT

Turning to FIG. 1 an integrated circuit 10 is illustrated having a substrate 12 on which a pair of conductive traces 14 and 16 are deposited. Each of the traces 14 and 16 are shown terminating at their ends with larger conductive connectors 18, 20, 22 and 24. The traces 14 are shown connected in series as indicated by the line 26 electrically connecting the connectors 20 and 24. A current source 28 applies a known current through the series connected traces 14 and 16. On each trace, a multiplicity of connections 30 connect a multiplicity of conductors 32 to the traces 14 and 16. Preferably, the connection points 30 are very closely spaced along the length of the traces. Typically, the connection points 30 are less than one micrometer apart. The conductors 32 are shown in FIG. 1 leading off of the substrate 12 to an analog multiplexer 34. A clock 36 provides a clock signal 38 to the multiplexer (MUX) 34. Connected to the output of the multiplexer, an instrumentation amplifier 40 receives as inputs the voltage drop across each pair of adjacent conductors 32 at a rate at which the clock 36 steps the multiplexer. Signal processing circuitry 42 receives as its input the amplified voltages from the amplifier 40. The signal processing circuitry can be a resistance meter, a voltmeter, an oscilloscope, an analog to digital converter, computer circuitry for recording and calculating resistance and locating the segments, or other device or circuit to monitor the resistance or voltage drop between connections 30 along the traces 14 and 16.

Although only the traces 14 and 16 and their connectors 18, 20, 22 and 24, the connections 30 to the traces, and the conductors 32 as shown are formed on the substrate 12, in fact the multiplexer 34, amplifier 40 and some or all signal processing circuitry can be integrated if desired. This is indicated by the broken line 44 indicating a more comprehensive substrate on which the MUX, the amplifier and the signal processing circuit are integrated.

In other words, this technique can be used at the wafer, or package level or in a fully integrated IC. At the wafer or package level, the monitoring electronics will be separate from the wafer or die containing the interconnects under study. In a fully integrated custom IC, the monitoring electronics can be on chip with the interconnects being studied. The advantage is the substantial increase in the number of sites that can be monitored, since the segment taps or connections 30 do not need to go off chip through a limited number of I/O pads or micromanipulator probes. The monitoring circuitry would, however, need to operate at elevated temperatures making SOI an attractive candidate for the IC. As a compromise, just the analog MUX could be built on chip.

Although preferred embodiments of the invention have been described in detail, it will be readily appreciated by those skilled in the art that further modifications, alterations and additions to the invention embodiments disclosed may be made without departure from the spirit and scope of the invention as set forth in the appended claims.

We claim:

1. A method for measuring electromigration resistance in a copper trace disposed over a silicon substrate, comprising:
   providing the copper trace;
   dividing the copper trace into one hundred segments of less than one micrometer in length; and
   coupling a resistance meter to each copper trace segment of the one hundred copper trace segments, wherein each copper trace segment has a single resistance meter coupled thereto and each resistance meter is coupled to a single copper trace segment.

2. A method for detecting electromigration in at least one conductive trace disposed on a substrate comprising:
   (a) providing the at least one conductive trace on the substrate;
   (b) providing a series of more than 10 electrical connections closely spaced along the trace to a set of conductors;
   (c) applying an electrical current through the trace; and
   (d) observing an output indicative of resistance from one conductor to the next between each pair of adjacent conductors.

3. The method for detecting electromigration according to claim 2, further comprising continually polling each pair of adjacent conductors connected along the trace, to continually observe resistance of segments of the trace from one conductor to the next.

4. The method for detecting electromigration according to claim 3, wherein continually polling each pair of conductors comprises providing an analog multiplexer, connecting the conductors to the multiplexer, applying a clock signal to the multiplexer to step the multiplexer to connect voltages across pairs of the conductors with the multiplexer output and providing a resistance indicative circuit connected to the output of the multiplexer.

5. The method for detecting electromigration according to claim 4, wherein the voltage measuring circuit comprises an amplifier connected to the output of the multiplexer and a voltage responsive device connected to the output of the amplifier to indicate resistance based on the voltage output of the amplifier.

6. The method for detecting electromigration according to claim 4, wherein the resistance indicative circuit comprises a voltmeter.

7. The method for detecting electromigration according to claim 2, wherein step (a) comprises providing a pair of substantially parallel conductive traces on the substrate, steps (b) comprises providing electrical connections along each of the traces to the set of conductors, step (c) comprises applying an electrical current through each of the traces, and step (d) comprises observing an output indicative of resistance from one conductor to the next between each pair of adjacent conductors along each of the traces.

8. The method for detecting electromigration according to claim 7, wherein the electrical connections in step (b) are spaced less than one micrometer apart along each trace.

9. The method for detecting electromigration according to claim 7, wherein step (d) comprises:
   (i) repeatedly measuring the voltage drop from one conductor connection to the next along each trace; and
   (ii) repeatedly calculating from the current through each trace and the voltage drop measured the resistance of each segment of each trace from one conductor to the next along each of the traces.

10. The method for detecting electromigration according to claim 2, wherein the electrical connections provided in step (b) are spaced less than one micrometer apart along the at least one trace.

11. The method for detecting electromigration according to claim 2, wherein step (d) comprises:
(i) repeatedly measuring the voltage drop from one conductor connection to the next along the trace; and
(ii) repeatedly calculating from the current through the trace and the voltage drop measured the resistance of each segment of the trace from one conductor connection to the next along the trace.

12. The method for detecting electromigration according to claim 2, further comprising determining the presence or absence of electromigration from the observance of resistance from one conductor to the next along the trace.

13. The method for detecting electromigration according to claim 2, further comprising determining the presence or absence of early stage void or hillock formation along the trade by observance of resistance from one connector to the next along the trace.

14. The method for detecting electromigration according to claim 2, wherein the series of more than 10 electrical connections comprises at least 100 electrical connections to a set of at least 100 conductors.

15. The method for detecting electromigration according to claim 14, wherein the electrical connections are spaced less than a micrometer apart along the trace.

16. A device for detecting electromigration in at least one conductive trace disposed on a substrate comprising:
(a) at least one conductive trace on the substrate;
(b) a series of more than 10 electrical connections closely spaced along the trace to a set of conductors;
(c) connectors for applying an electrical current through the trace; and
(d) a resistive-indicative circuit connected to the conductors to provide an output indication of resistance from one conductor to the next between each pair of adjacent conductors.

17. The device for detecting electromigration according to claim 16, further comprising means for continually polling each pair of adjacent conductors connected along the trace, to continually observe with said circuit connected to the conductors an output related to the resistance of segments of the trace from one conductor to the next.

18. The device for detecting electromigration according to claim 17, wherein the means for continually polling each pair of conductors comprises an analog multiplexer, connecting the conductors to the multiplexer, means for applying a clock signal to the multiplexer to step the multiplexer to connect voltages across pairs of the conductors with the multiplexer output and resistance-indicative circuit connected to the output of the multiplexer.

19. The device for detecting electromigration according to claim 18, wherein the resistance-indicative circuit comprises an amplifier connected to the output of the multiplexer and a voltage responsive device connected to the output of the amplifier to indicate resistance based on the voltage output of the amplifier.

20. The device for detecting electromigration according to claim 18, wherein the resistance-indicative circuit comprises a voltmeter.

21. The device for detecting electromigration according to claim 16, wherein the at least one trace comprises a pair of substantially parallel conductive traces on the substrate, the electrical connections comprising electrical connections along each of the traces to the set of conductors, the connectors for applying an electrical current comprising connectors for applying an electrical current through each of the traces, and the circuit connected to the conductors comprises means for providing an output indicative of the resistance from one conductor to the next between each pair of adjacent conductors along each of the traces.

22. The device for detecting electromigration according to claim 21, wherein the electrical connections are spaced less than one micrometer apart along each trace.

23. The device for detecting electromigration according to claim 21, wherein the circuit connected to the conductors comprises:
(i) means for repeatedly measuring the voltage drop from one conductor connection to the next along each trace; and
(ii) means for repeatedly calculating from the current through each trace and the voltage drop measured the resistance of each segment of each trace from one conductor to the next along each of the traces.

24. The device for detecting electromigration according to claim 16, wherein the electrical connections are spaced less than one micrometer apart along the at least one trace.

25. The device for detecting electromigration according to claim 16, the circuit connected to the conductors comprises:
(i) means for repeatedly measuring the voltage drop from one conductor connection to the next along the trace; and
(ii) means for repeatedly calculating from the current through the trace and the voltage drop measured the resistance of each segment of the trace from one conductor connection to the next along the trace.

26. The device for detecting electromigration according to claim 16, wherein the series of more than 10 electrical connections comprises at least 100 electrical connections to a set of at least 100 conductors, whereby a relative resistance increase between a particular pair of connections as compared to the resistance between other pairs of connections locates electromigration on the trace at the length of trace between the particular pair of connectors.

27. The device for detecting electromigration according to claim 26, wherein the distance between connections along the trace is no greater than a micrometer, whereby electromigration can be located on the trace to within a micrometer by detection of a resistance increase between the particular pair of connections.

* * * * *